United States Patent [19]

Rattcliff et al.

[11] 3,860,313

[45] Jan. 14, 1975

[54] CIRCUIT BOARD

[75] Inventors: Graham Rattcliff, South Nutfield; Ronald Sidney Thomas Kemp, Coulsdon, both of England

[73] Assignee: Thomas Jermyn, Sevenoaks, Kent, England

[22] Filed: May 17, 1973

[21] Appl. No.: 361,167

Related U.S. Application Data

[63] Continuation-in-part of Ser. No. 241,521, April 6, 1972.

[30] Foreign Application Priority Data

June 7, 1972 Great Britain .................... 26467/72
Apr. 23, 1972 Great Britain .................... 11079/71

[52] U.S. Cl. ........ 339/17 C, 174/68.5, 317/101 CC
[51] Int. Cl. ......................... H01r 13/54, H05k 1/04
[58] Field of Search ............. 339/17, 176, 275, 278; 317/101 C, 101 CC, 101 CP; 174/68.5

[56] References Cited

UNITED STATES PATENTS

| | | | |
|---|---|---|---|
| 2,297,488 | 9/1942 | Luderitz | 339/17 B X |
| 2,699,425 | 1/1955 | Nieter | 339/17 B X |
| 2,984,697 | 5/1961 | Bontecue et al. | 339/17 C X |
| 3,219,886 | 11/1965 | Katzin | 317/101 CP |
| 3,263,200 | 7/1966 | Kocmich | 339/17 C |
| 3,287,795 | 11/1966 | Chambers et al. | 317/101 CP X |
| 3,349,480 | 10/1967 | Rashleigh | 174/68.5 X |
| 3,400,210 | 9/1968 | Reimer | 174/68.5 |
| 3,568,129 | 3/1971 | Gold et al. | 339/17 CF |
| 3,605,075 | 9/1971 | Stofkooper | 339/126 |

FOREIGN PATENTS OR APPLICATIONS

| | | | |
|---|---|---|---|
| 1,087,861 | 10/1967 | Great Britain | 339/17 CF |
| 1,240,789 | 7/1971 | Great Britain | 317/101 CP |

*Primary Examiner*—Roy D. Frazier
*Assistant Examiner*—Terrell P. Lewis
*Attorney, Agent, or Firm*—Fleit & Jacobson

[57] ABSTRACT

A circuit board comprising a body of electric insulating material provided with mounting locations for electrical components with means for permitting conductors to pass through the board at the locations.

The board is formed with a plurality of socket recesses at each location with at least one through hole for each recess. The body and the interior of the holes having been coated with a conductive layer, portions of the layer are selectively removed to leave conductive material in the recesses and holes and as conductors therebetween.

6 Claims, 4 Drawing Figures

CIRCUIT BOARD

RELATED APPLICATION

This application is a continuation-in-part of our copending application Ser. No. 241,521 filed Apr. 6 1972.

This invention relates to circuit boards for the mounting of integrated circuits and other electrical components.

Generally this invention relates to an improvement in or modification of the subject matter of copending U.S. Pat. application Ser. No. 241,521 which broadly relates to an electrical socket in which instead of providing electrical connections by mounting metal parts in a body of an insulating material, for example a synthetic plastics material, the necessary electrical connections are provided by plating, or otherwise coating, selected portions of the body with an electric conducting material.

The present invention relates to the extension of this plated socket concept to a complete plug-in circuit board.

According to the present invention there is provided a circuit board comprising a body of electric insulating material having a plurality of electrical component receiving locations, each receiving location comprising a plurality of socket recesses moulded in the body adjacent through holes extending through the body, there being provided through holes individual to different recesses, the interior of the through holes and the body being coated with electrically conducting material which has subsequently been selectively removed to leave conductive material in the recesses and the through holes and on the body to provide connections from the recesses to the through holes individual thereto. Conveniently at those locations where electrically conductive portions are required the body surface may comprise channels in the insulating material which, upon removal of coating material from portions of the insulating material surrounding these channels, provide for the retention of a surface covering of the conducting material in the bottoms of the channels to act as an electric conductor. Preferably and conveniently the electrically insulating material is synthetic plastics material while the coating material is metal plated thereon. In most cases copper is a convenient plating metal although in some cases it may be desirable, especially where good connections for very low current values are required, to use gold or silver as a plating material. Preferably each of the locations is arranged with a plurality of recesses arranged in parallel and adapted to receive the terminals of an integrated circuit with means being provided for clamping the terminals into individual ones of the recesses. Conveniently this can be done by, at each location, having a raised projecting body portion projecting above the main plane of the board with the recesses being provided in the sides of these body portions, a clamping ring being provided with ramps engaging in the individual recesses whereby when the ring is fitted around the projecting portion the ramps thereon engage in the recesses for tightly engaging connectors from integrated circuits or other electric components against the conductive bottom portion of the recess. Conveniently the rings may be provided with means engageable with the circuit board for holding them in secure clamping position. Thus the rings may be provided with resilient tongues with a hooked portion adapted to fit within locking apertures in the circuit board.

The board could be employed either for "bread boarding" that is interconnecting the sockets with wires soldered into the plated through holes, or in an alternative arrangement a printed circuit may be provided on the rear of the board using standard etching techniques.

The invention will be further described, by way of example, with reference to the accompanying drawing, in which.

Figure 1:
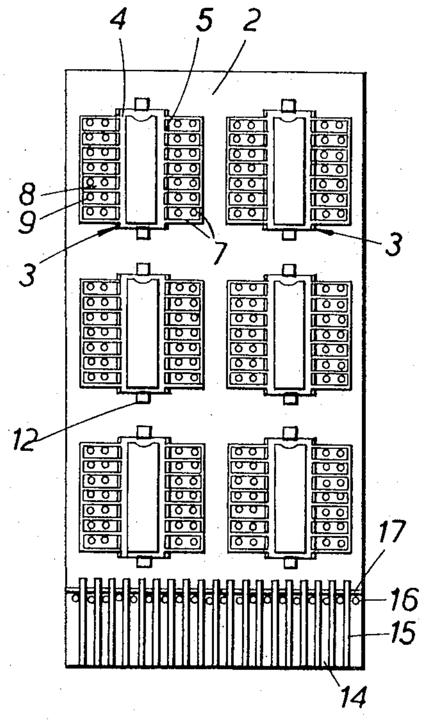
FIG. 1 is a top view of a circuit board embodying the invention.
Figure 2:
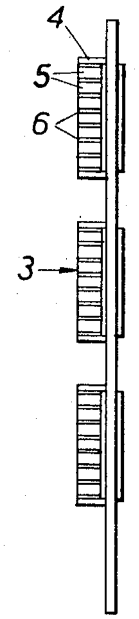
FIG. 2 is a side view of the circuit board of FIG. 1.
Figure 3:
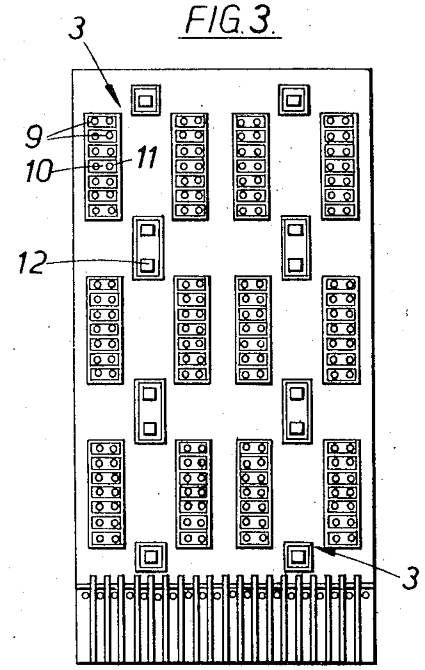
FIG. 3 is a bottom plan view of the circuit board of FIG. 1.

Referring to the drawing there is shown a circuit board particularly adapted for use with "bread boarding" techniques which comprises a main base 2 having thereon at a plurality of socket locations 3 upwardly projecting body portions 4 which may be moulded integrally with the board or which may be applied to the base board in a separate manufacturing operation. The longer sides of the rectangular projecting body portions 4 are provided with a plurality of recesses 5 separated by ribs 6. The recesses 5 are aligned with recessed portions or channels 8 defined by ribs 7 on the upper surface of the board. Through holes 9 extend through the base of the board from the recesses 8 to corresponding recesses or channels 10 defined by ribs 11. Holes 12 are provided through the board for the receipt of retaining clips in a manner to be described.

The recesses 5, 8 and 10 and the interiors of the through holes 9 are provided with an electrical conductive layer coated by having been metal plated while a series of plated portions 14 connected with through holes 16 are formed at one end of the board and separated from each other by saw cuts 15 and 17 used to remove the plating material subsequent to plating.

Generally when making this circuit board, following plating of the board the metal plating is removed from the top of the ribs 6, 7 and 11 so as to separate the conductive material associated with the adjacent set of recesses 5, 8 and 10 with through holes 11.

Figure 4:
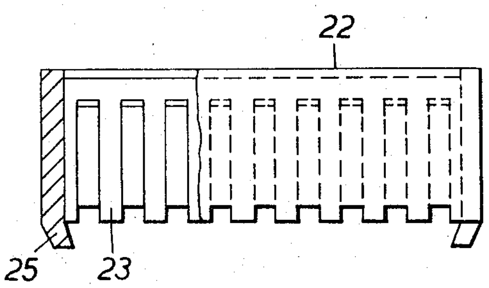
FIG. 4 is an enlarged part longitudinal sectional view of a clamping ring for use at an individual component receiving location of the board.

A clamping ring 22 shown in FIG. 4, is provided for each of the projecting body portions 4, adapted to fit around the body portions with ramps 23 fitting into the recesses 5 so as to clamp any terminal received in a recess against the conductive coated bottom portion of the recess. The clamping rings 22 are provided with resilient tongues 25 adapted to be fitted in the apertures 12 for retaining the clamping rings in position once a circuit element has been mounted at a particular location 3. The general form of action of the clamping rings in conjunction with the body portion 4 may be generally similar to the arrangement described in detail in the Specification of the above-mentioned copending Application.

As indicated above the circuit board described is generally adapted for use in "bread-boarding" as wires can conveniently be soldered into the through holes 9 at the rear of the board for interconnecting the various parts of the various circuit components and also to such connections 14 as are required via appropriate through holes 16. However it will be appreciated that in an alternative arrangement it would be perfectly possible to apply a printed circuit to the rear of the circuit board to form in the circuit board the necessary connections between the various connections for the individual recesses 5.

We claim:

1. A circuit board comprising a body of electric insulating material having a plurality of electrical component receiving locations, each said location having a raised projecting body portion thereat projecting from the plane of the board and provided with a plurality of socket recesses arranged in parallel and adapted to receive the terminals of an electrical circuit component, said recesses being provided in the sides of said body portion, said socket recesses being moulded in the body adjacent through holes extending through the body, there being provided a through hole individual to each different recess, the body and the interior of the through holes having been coated with electrically conducting material which has subsequently been selectively removed to leave conductive material in the recesses and the through holes and on the body to provide electrical connections from the recesses to the through holes individual thereto, means for clamping the terminals into individual ones of said recesses, said clamping means comprising a clamping ring provided with ramps engaging in the individual recesses whereby when the ring is fitted around the projecting portion the ramps thereon engage in the recesses for tightly engaging connectors from electrical circuit components against the conductive material in said recesses.

2. A circuit board according to claim 1 wherein the body surface comprises channels in the insulating material where electrically conductive portions are required, coating material being present in said channels but absent from portions of the insulating material on either side of these channels.

3. A circuit board according to claim 1, wherein the electrically insulating material is a synthetic plastics material and the coating material is metal plated thereon.

4. A circuit board according to claim 1, wherein the plating metal comprises copper.

5. A circuit board according to claim 1, wherein said rings are provided with means engageable with the circuit board for holding them in secure clamping position.

6. A circuit board according to claim 1, wherein the circuit board is provided with a plurality of locking apertures and said rings are provided with resilient tongues having hooked portions adapted to fit within said locking apertures in the circuit board.

* * * * *